(12) United States Patent
Lesbats et al.

(10) Patent No.: US 8,957,702 B2
(45) Date of Patent: Feb. 17, 2015

(54) SIGNALLING CIRCUIT, PROCESSING DEVICE AND SAFETY CRITICAL SYSTEM

(75) Inventors: Mathieu Lesbats, Munich (DE); Hubert Bode, Haar (DE); Rafael Pena Bello, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/232,479

(22) PCT Filed: Aug. 1, 2011

(86) PCT No.: PCT/IB2011/053419
§ 371 (c)(1),
(2), (4) Date: Jan. 13, 2014

(87) PCT Pub. No.: WO2013/017913
PCT Pub. Date: Feb. 7, 2013

(65) Prior Publication Data
US 2014/0169495 A1    Jun. 19, 2014

(51) Int. Cl.
*H03K 19/0175* (2006.01)
*H04L 25/02* (2006.01)
*H03K 19/003* (2006.01)

(52) U.S. Cl.
CPC .......... *H04L 25/02* (2013.01); *H03K 19/00361* (2013.01); *H03K 19/017509* (2013.01)
USPC ................................. 326/80; 326/83; 326/81

(58) Field of Classification Search
None
See application file for complete search history.

(56) References Cited

U.S. PATENT DOCUMENTS

| | | | | |
|---|---|---|---|---|
| 5,121,001 A * | 6/1992 | Dansky et al. | ................ | 326/89 |
| 5,949,259 A * | 9/1999 | Garcia | ................ | 327/111 |
| 6,005,413 A * | 12/1999 | Schmitt | ................ | 326/80 |
| 6,060,906 A * | 5/2000 | Chow et al. | ................ | 326/81 |
| 6,118,324 A * | 9/2000 | Li et al. | ................ | 327/384 |
| 6,130,556 A * | 10/2000 | Schmitt et al. | ................ | 326/81 |
| 6,181,156 B1 * | 1/2001 | Durham et al. | ................ | 326/27 |
| 6,184,703 B1 * | 2/2001 | Vest et al. | ................ | 326/27 |
| 6,225,819 B1 * | 5/2001 | Rees et al. | ................ | 326/30 |
| 6,313,664 B1 * | 11/2001 | Hall et al. | ................ | 326/83 |
| 6,657,459 B2 * | 12/2003 | Nishio et al. | ................ | 326/83 |
| 6,750,695 B2 * | 6/2004 | Blodgett et al. | ................ | 327/333 |
| 7,280,092 B2 | 10/2007 | Landolt | | |
| 2004/0178823 A1 * | 9/2004 | Ananthanarayanan et al. | | 326/87 |

(Continued)

OTHER PUBLICATIONS

International Search Report and Written Opinion correlating to PCT/IB2011/053419 dated Apr. 18, 2012.

*Primary Examiner* — Crystal L Hammond

(57) ABSTRACT

A signalling circuit for a signal channel of a communication network comprises a communication network terminal connectable to the signal channel and to a voltage supply; an input terminal connectable to receive a transmit signal; a driver device comprising a first driver terminal connected to the communication network terminal, a second driver terminal connected to ground, and a driver control terminal connected to the input terminal; wherein the driver device is arranged to connect the communication network terminal to ground in response to a transition from a low to a high voltage driver control signal state of a driver control signal received at the driver control terminal. And the signalling circuit comprises a feedback circuit connected to the first driver terminal and the driver control terminal and comprising a capacitive device; and a pull-down device arranged to connect the driver control terminal to ground after a predefined delay after a transition of the transmit signal from a low to a high voltage transmit signal state.

10 Claims, 5 Drawing Sheets

(56) References Cited

U.S. PATENT DOCUMENTS

| 2006/0139051 | A1 | 6/2006 | Gallo et al. |
| 2007/0164789 | A1* | 7/2007 | Panjwani et al. ............... 326/80 |
| 2008/0069376 | A1 | 3/2008 | Rashid et al. |
| 2010/0244907 | A1 | 9/2010 | Gagne et al. |
| 2010/0315053 | A1 | 12/2010 | Koh et al. |
| 2014/0145760 | A1* | 5/2014 | Nguyen et al. ............... 326/82 |

* cited by examiner

_US 8,957,702 B2_

SIGNALLING CIRCUIT, PROCESSING DEVICE AND SAFETY CRITICAL SYSTEM

FIELD OF THE INVENTION

This invention relates to a signalling circuit, a processing device and a safety critical system.

BACKGROUND OF THE INVENTION

A communication network is a collection of nodes connected together to enable communication, for example data communication, between the nodes of the communication network. A node may be a computer or any other processing device or circuitry arranged to send and receive data over the communication network. Communication networks are, for example, used in vehicles. Fieldbus systems, such as, for example, controller-area network (CAN) bus, FlexRay or Local Interconnect Network (LIN) systems are used, for example, for real-time distributed control for enabling data exchange between processing devices, sensors and actuators of the vehicle. Each node contains a communication network terminal for connecting to a signal channel of the communication network. A signal channel may, for example, be a serial bus or part of a bus comprising more than one signal channel. A signal channel may refer to a signal line or signal wire. It may also refer to a wireless connection between at least two communication network terminals.

For example, LIN is a broadcast serial network comprising one master and many slaves, wherein all messages are initiated by the master with not more than one slave replying for a given message identifier. The master and slave functionalities may, for example, be implemented in microcontrollers or application-specific integrated circuits. Each master and slave contains a signalling circuit for transmitting signals on the signal channel. A signalling circuit of a LIN node may, for example, be part of a transceiver arranged to transmit signals on and receive signals from the signal channel.

As shown in FIG. 1, an example of a prior art signalling circuit 10, for example, of a LIN bus system of a vehicle, such as a car, may comprise a communication network terminal 12 connected to a voltage supply 14, such as a battery of a car, via a pull-up resistor 16 and a diode 18. For a positive supply voltage, such as, for example, +12V, the communication network terminal 12 is on a high voltage level as long as it is not connected to allow a current flow to ground 22, 24. The diode 18 may be used for protection of the voltage supply 14 from reverse current flowing into the supply due to a higher voltage on the communication network terminal 12 than on the supply 14.

A driver transistor device 20, for example, a field-effect transistor (FET), is used for connecting the communication network terminal 12 to ground 22, 24, depending on a driver control signal received at the control terminal of the driver transistor device 20, i.e. the gate of the shown FET.

A signal may be a change of a physical quantity carrying information, for example a voltage level.

The driver control signal is determined by the information to be transmitted on the signal channel. It may be a binary information, either "0" or "1", wherein, for example, LIN is based on transmitting data through a binary model of dominant bits and recessive bits, wherein dominant corresponds to a logical 0 and recessive corresponds to a logical 1. If one node transmits a dominant bit and another transmits a recessive bit then the dominant bit is evaluated. As shown, the communication network terminal 12 may be in recessive state, i.e. on a high voltage level, until it is connected to ground.

The information to be transmitted, i.e., the transmit signal, is generated by either applying current to or drawing current from the control terminal of the driver transistor device 20, illustrated by either connecting it to a first current source 26 when closing the first switch 28 for applying current $I_{dominant}$ and generating a transmit signal tx=0 or connecting it to a second current source 30 when opening the first switch 28 and closing the second switch 48 for drawing current $I_{recessive}$ to ground 24 and generating a transmit signal tx=1.

As shown, the driver control terminal receives a control signal that is not identical to the generated transmit signal. The gate or driver control terminal of the driver transistor device 20 may be directly connected to a capacitor 34 connected to the drain terminal of the driver transistor device 20. Alternatively, as shown, the driver control terminal of the driver transistor device 20 may be connected to a source of a source follower transistor device 32, i.e., a common drain FET amplifier, wherein the gate of the source follower transistor device 32 may be connected to the capacitor 34, which is connected to the drain terminal of the shown driver transistor device 20. This implements a feedback loop that introduces a slew rate for state change of the signal delivered at the communication network terminal 12, wherein the slew rate depends on the capacity of the capacitive device 34. The capacitor 34 may be directly connected to the drain terminal of the shown driver FET device 20 or, for example, via an isolation diode 36 for avoiding current flow into the communication network terminal 12 in case of any disturbances.

FIG. 2 schematically shows three example diagrams of voltage (in volts) vs. time (in microseconds). The transient response of a transmit signal tx 40, encountered at node 38, illustrates signalling a recessive bit, i.e., high voltage level, followed by a dominant bit, i.e., low or 0 voltage level, and by a recessive bit, i.e., high voltage level. The signal 42 encountered at the communication network terminal 12 provides the same information, with a slew rate of about 9 microseconds for a transition between a dominant and a recessive, i.e., high, signal state. The third signal 44 received at another node of the communication network or at a receiver side of a transceiver that comprises the transmitting signalling circuit 10 is a recovered version of the transmit signal, delayed at least by the time of the slew rate for signal state change in the transmitted signal.

SUMMARY OF THE INVENTION

The present invention provides a signalling circuit, a processing device and a safety critical system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary, as illustrated, for the understanding and appreciation of the underlying concepts of the present invention and in order not to obfuscate or distract from the teachings of the present invention.

Figure 3:
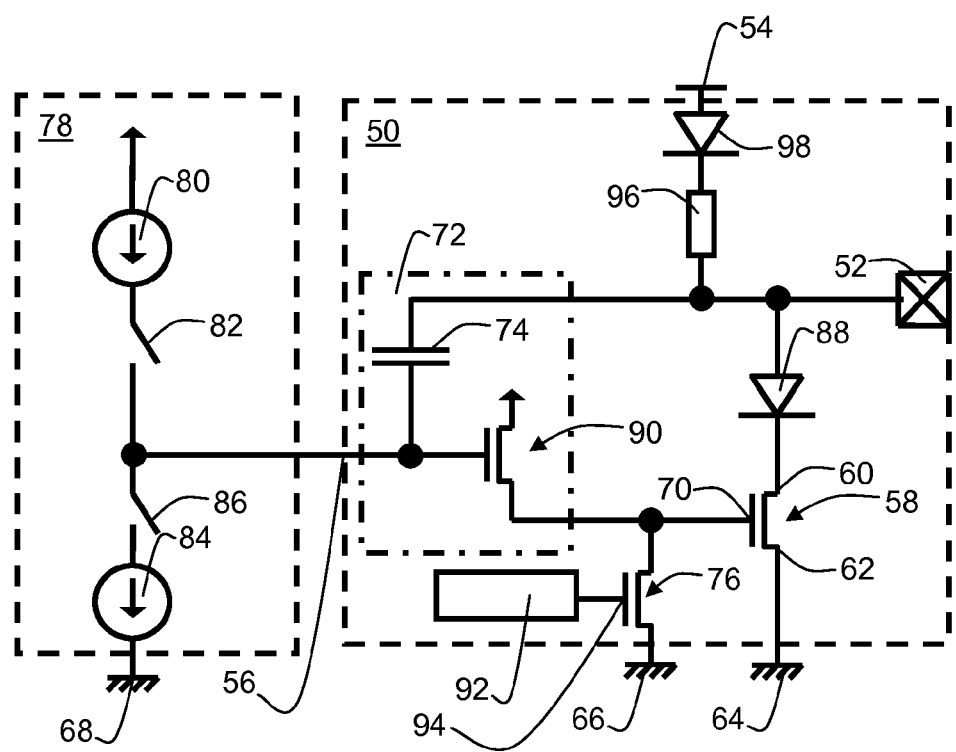
FIG. 3 schematically shows an example of an embodiment of a signalling circuit.

Referring to FIG. 3, an example of an embodiment of a signalling circuit is schematically shown. The shown signalling circuit 50 for a signal channel of a communication network comprises a communication network terminal 52 connectable to the signal channel (not shown) and to a voltage supply 54; an input terminal 56 connectable to receive a transmit signal; a driver device 58 comprising a first driver terminal 60 connected to the communication network terminal 52, a second driver terminal 62 connected to ground 64, 66, 68 and a driver control terminal 70 connected to the input terminal 56.

The driver device 58 is arranged to connect the communication network terminal 52 to ground 64 in response to a transition from a low to a high voltage driver control signal state of a driver control signal received at the driver control terminal 70. A feedback circuit 72 is connected to the first driver terminal 60 and the driver control terminal 70 and comprises a capacitive device 74. A pull-down device 76 is arranged to connect the driver control terminal 70 to ground 64 after a predefined delay after a transition of the transmit signal from a low to a high voltage transmit signal state.

The shown signalling circuit 50 may be used, for example, for communication in a vehicle or automotive communication network. The signalling circuit may, for example, be comprised in a Local Interconnect Network (LIN) device. The LIN device may serve as a master or as a slave of a LIN network.

The voltage supply 54 may, for example, be a battery of a car, e.g., providing +12V, or any other power source arranged to provide a voltage level or potential above ground potential to the communication network terminal 52, as long as the communication network terminal 52 is not connected, i.e. electrically connected, to ground 64, 66, 68.

The signalling circuit 50 may comprise a resistive device 96 connected between the communication network terminal 52 and the voltage supply 54, i.e. the communication network terminal 52 may be connected to the voltage supply through a resistive device 96 as a pull-up device, and for example, through a protection diode 98.

The driver device 58 may be any switching device arranged to drive a current and connect the first driver terminal 60 to the second driver terminal 62, depending on a signal received at the driver control terminal 70. The driver device 50 may, for example, be a transistor device. For example, the driver device may be a FET having drain, source, and gate terminals. Alternatively it may, for example, be a bipolar transistor having collector, emitter and base terminals.

The communication network terminal 52 and the first driver terminal 60 may be connected directly, i.e., by an electrically connecting line not containing additional devices. Alternatively the signalling circuit may, for example, comprise a diode 88 connected between the communication network terminal 52 and the first driver terminal 60, for example, to serve as an isolation diode, for reducing disturbances in the signalling circuit 50 caused by, for example, noise and disturbance received on the signalling channel, wherein the anode of the diode 88 may be connected to the communication network terminal 52 and the cathode may be connected to the first driver terminal 60.

The input terminal 56 may be connected to a transmit signal generation unit 78. The transmit signal generation unit 78 may, for example, generate the transmit signal by applying current to or drawing current from input terminal 56 and, thereby, from the driver control terminal 70 of the driver device 58. In the shown example implementation, this may be achieved by connecting the input terminal 56 to a first current source 80 of the transmit signal generation unit 78 when closing the first transmit signal switch 82 for applying current $I_{dominant}$ and generating a transmit signal tx=0 and by connecting the input terminal 56 to a second current source 84 of the transmit signal generation unit 78 when opening the first transmit signal switch 82 and closing a second transmit signal switch 86 for drawing current $I_{recessive}$ to ground 68 and generating a transmit signal tx=1. The transmit signal generation may, for example, be controlled by a control unit arranged to control transmit signal bit generation according to, for example, a network communication protocol.

The feedback circuit 72 connected to the first driver terminal 60 and the driver control terminal 70 may be a feedback loop having two terminals or nodes, a first one connected to the first driver device terminal 60 and a second one connected to the driver control terminal 70, wherein the term "connected" may comprise direct and indirect electrical connections, wherein a direct connection may refer to a connection by an electrically connecting line not containing additional devices. For example, the feedback circuit 72 may be connected directly to the first driver device terminal, or, as shown in FIG. 3, through an isolation diode 88.

The feedback circuit 72 may comprise the capacitive device 74. The feedback circuit 72 may (or may not) additionally comprise a source follower transistor device 90, i.e. a common drain amplifier arranged to amplify a current or voltage received at its gate terminal, wherein the source terminal may provide the driver control signal applied to the driver control terminal 70 of the driver device 58.

The capacitive device 74 of the feedback circuit 72 may be a capacitor or any other device having capacitive characteristics. The feedback circuit 72 with the capacitive device 74 that introduces a capacity dependent slew rate for state change of the signal delivered at the communication network terminal 52 and may be considered a slew rate control loop for the signal provided at the communication network terminal 52, which may be a LIN pin, to be transmitted on the signal channel.

The pull-down device 76 shown in FIG. 3 may be connected to the driver control terminal 70 of the driver device 58. It may allow to bypass provision of the driver control signal by the feedback circuit 72 and may connect the driver control terminal 70 to ground 64 after the predefined delay after a transition of the transmit signal, i.e., the signal received at the input terminal 56, from a low to a high voltage transmit signal state. The high voltage signal state may be a defined voltage level or potential higher than a voltage level or potential corresponding to the low voltage signal state, wherein low and high voltage transmit signal states, e.g., 0V and 2V or 0V and 1.8V, may be defined differently from low and high voltage driver control signal states, e.g., 0V and 12V.

This may force the signal provided at the communication network terminal 52 into recessive state, independently of its previous state and whether or not a state transition from low to high voltage driver control signal state has been detected. This delayed forced pull-down may not disturb normal operation of the signalling circuit 50, since it may fall within a period of time wherein the driver control signal already triggered the driver device 58 to disconnect the communication network terminal 52 from ground 64.

The signal channel may probably sometimes be subject to strong disturbances, for example, generated by other communication channels or devices or any change of the electrical environment of the signal channel, causing interference, noise, or, potentially high, disturbances of the voltage level at the communication network terminal 52. This may probably result in a malfunction of the slew rate control loop comprising the feedback circuit 72 and the driver device 58, where the loop may get stuck in dominant state, i.e. may be unable to end the dominant state, because the driver control terminal may be unable to turn off the driver device 58 and disconnect the communication network terminal 52 from ground 64. This may, for example, cause a loss of data during communication, which may, for example, be a LIN communication.

Connecting the driver control terminal 70 to ground, i.e., for example, directly turning off the gate of the driver device 58, after a time lag or delay, and enforcing return to recessive state may, for example, increase reliability and robustness of the signalling circuit 50 and the communication network. The integrity of data frames may be maintained even in very noisy environments.

The signalling circuit 50 may, for example, comprise a control unit 92 arranged to provide a pull-down signal, and the pull-down device 76 may comprise a pull-down control terminal 94 arranged to receive the pull-down signal for connecting the driver control terminal 70 to ground 66. The control unit may, for example be a processing device or a set of logic circuits connected to receive a clock signal and may be part of, or connected to, the signalling circuit 50. For example, the control unit 92 may be arranged to also control the transmit signal generation by the transmit signal generation unit 78. The control unit may be provided, for example, as a separate processing device or as part of, e.g., a transmitter or transceiver module of, for example, a LIN device or LIN node.

The pull-down device 76 may comprise a transistor device, for example a FET such as, for example, an n-channel metal-oxide FET (NMOS-FET). The transistor device may comprise a first pull-down terminal, e.g. a drain terminal, connected to driver control terminal 70, a second pull-down terminal, e.g. a source terminal connected to ground 66, and the pull-down control terminal 70 connected to the control unit 92. Or the pull-down device 76 may be any other transistor device, for example any other FET or a bipolar transistor, or other switch arranged to connect the driver control terminal 70 to ground 66. In yet another embodiment, a transistor device may, for example, comprise a plurality of transistor circuits coupled to provide the described functionality.

Figure 1:
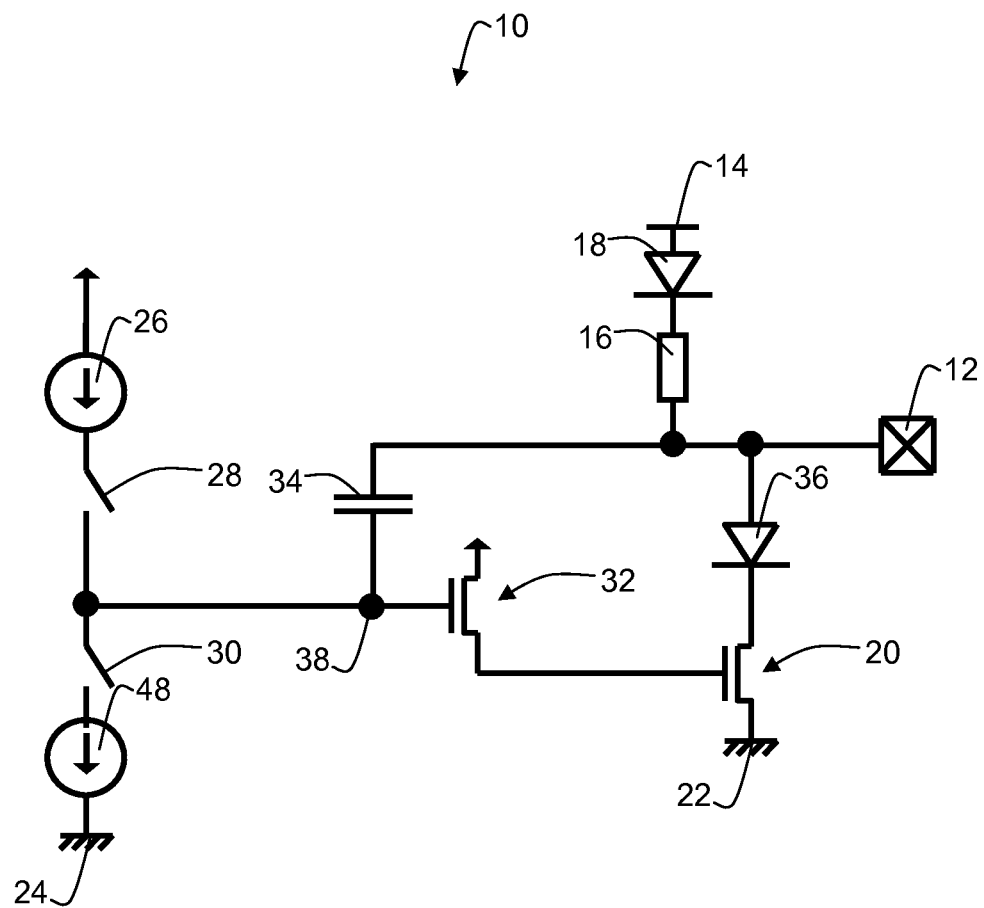
FIG. 1 schematically shows an example of a prior art signalling circuit.
Figure 2:
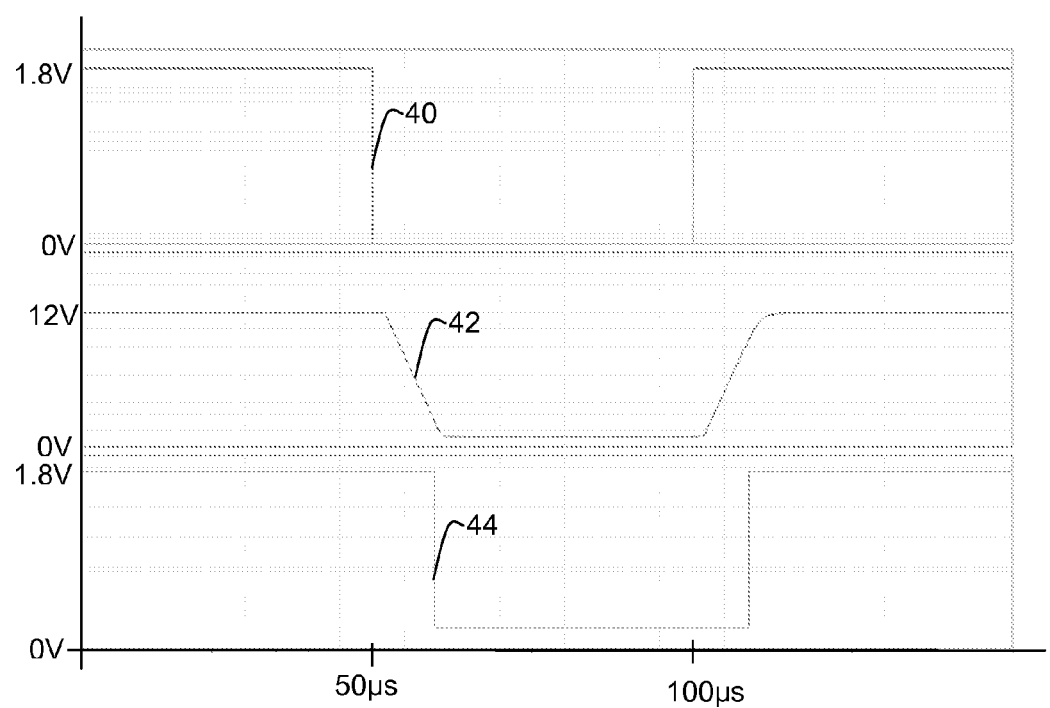
FIG. 2 schematically shows a first example diagram of transient response functions.
Figure 4:
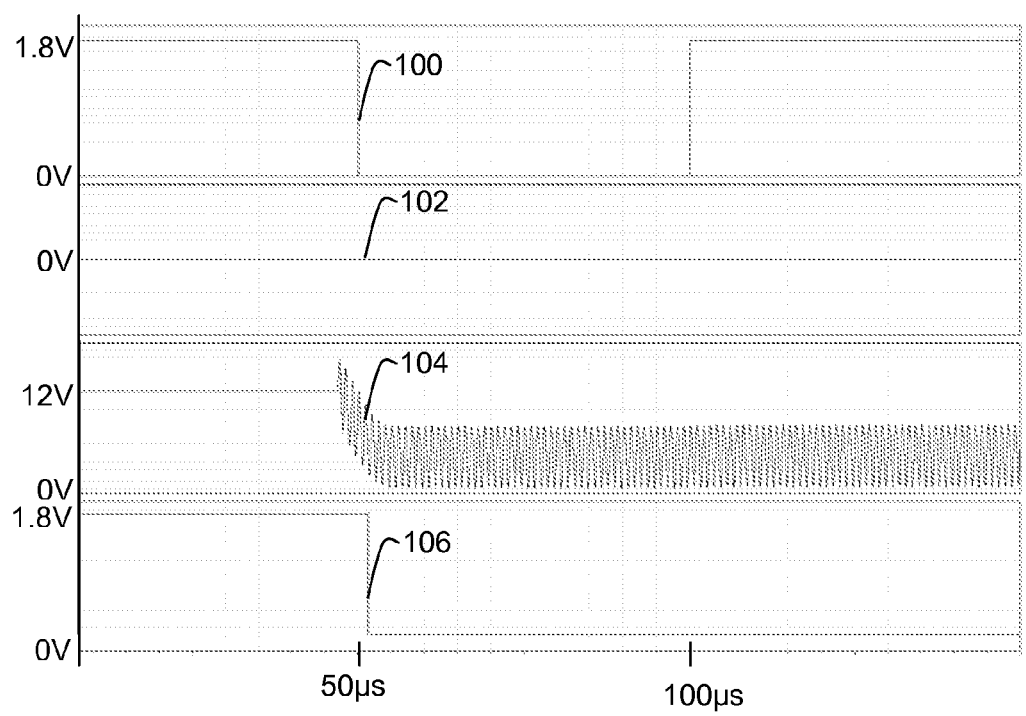
FIG. 4 schematically shows a second example diagram of transient response functions.

For the example of a signalling circuit 50 shown in FIG. 3, transient response functions may correspond to those shown in FIG. 2. In case of a disturbance received, for example, through the communication network terminal 52, transient response functions may be different. Referring to FIG. 4, a second example diagram of transient response functions is schematically shown.

FIG. 4 schematically shows four example diagrams of voltage (in volts) vs. time (in microseconds). The transient responses of a transmit signal tx 100, encountered at input terminal 56, illustrates signalling a recessive bit, i.e., high voltage level, followed by a dominant bit, i.e., low or 0 voltage level, and by a recessive bit, i.e., high voltage level. In the shown example, the transient response function of the pull-down signal 102 is set inactive, i.e. 0V, whereas the signalling circuit may receive a disturbance. In the shown example, the signal 104 encountered at the communication network terminal 52 may exhibit the disturbance, the signal, after transition from recessive, i.e. high, state to dominant, i.e. low, state may get stuck in the dominant state, although the transmit signal may indicate that a transition back into recessive state is required. The transient response 106 of a signal recovered at a receiver may exhibit the first recessive bit, whereas the received signal remains dominant once a transition to dominant state occurred, without returning to recessive state.

Figure 5:
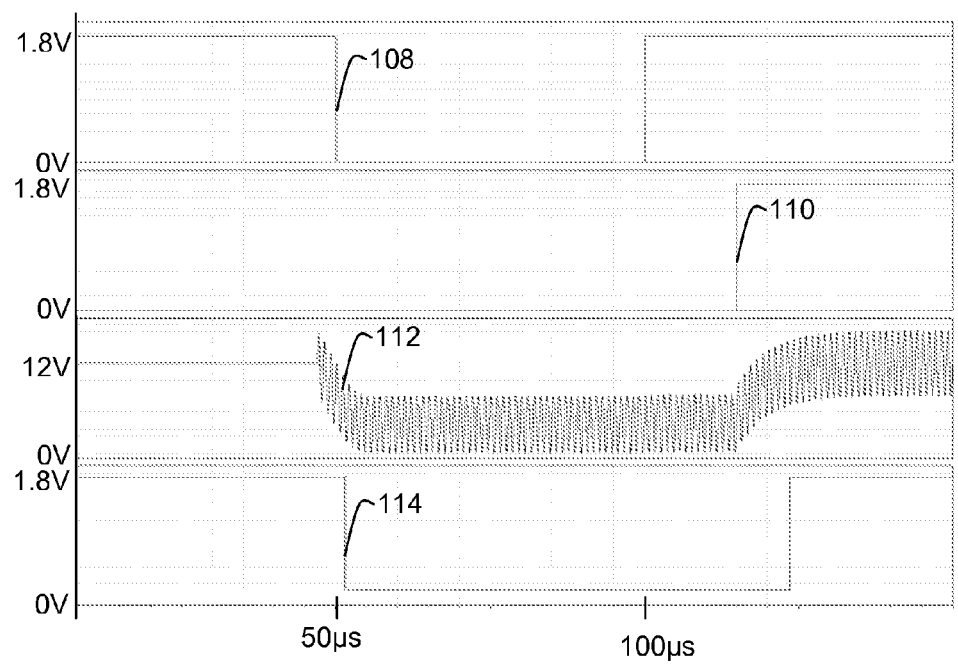
FIG. 5 schematically shows a third example diagram of transient response functions.

Referring to FIG. 5, a third example diagram of transient response functions is schematically shown. FIG. 5 schematically shows four example diagrams of voltage (in volts) vs. time (in microseconds). The transient responses of a transmit signal tx 108, encountered at input terminal 56, illustrates signalling a recessive bit, i.e., high voltage level, followed by a dominant bit, i.e., low or 0 voltage level, and by a recessive bit, i.e., high voltage level. In the shown example, the transient response function of the pull-down signal 110 may be set to high after a predefined delay after a transition of the transmit signal tx 108 from low to high voltage transmit signal state. This may correspond to connecting the driver control terminal to ground after the predefined delay and the signal provided at the communication network terminal 112 may, although the signalling circuit may receive a disturbance, not remain in dominant 0V state but may be pulled up to recessive state. The signal recovered at a receiver 114 may correctly comprise all signal states signalled with the transmit signal 108. The signal 114 may be received at another node of the communication network or at a receiver side of a transceiver that comprises the transmitting signalling circuit 50. The signal 114 is a recovered version of the transmit signal, wherein the transition from the shown dominant bit to the subsequent recessive bit may be delayed against the corresponding transition of the transmit signal 108 by at least the time of the slew rate for signal state change plus the predefined delay.

The predefined delay may, for example, be at least equal to or longer than a rise time from the low to the high voltage driver control signal state. This may prevent the delayed forced pull-down from disturbing the communication under normal conditions. The rise time may, for example, be determined by the capacitive device in the feedback circuit of the signalling circuit.

For a signalling circuit of a LIN device operating at, for example, about 20 kBit/sec, the predefined delay may, for example, be set to be between 10 and 20 microseconds, for example 15 microseconds.

The predefined delay may, for example, be provided to the control unit as a constant delay. In an embodiment of the signalling circuit 50, the control unit 92 may be arranged to adapt the predefined delay. For example, the predefined delay may depend on a physical condition of the signalling circuit 50, and the control unit 92 may be arranged to adapt the predefined delay in response to the physical condition of the signalling circuit, e.g. in response to temperature, age or used material of an integrated circuit die carrying the signalling circuit 50.

The predefined delay may, for example, depend on an operation mode of the communication network. A LIN network may, for example, be operated at different bus frequencies, such as 20 kBit/sec and 10 kBit/sec and a predefined delay may be adjusted depending on the current mode of operation. It may, just to give an example, be set to 15 microseconds or 25 microseconds, respectively.

Figure 6:
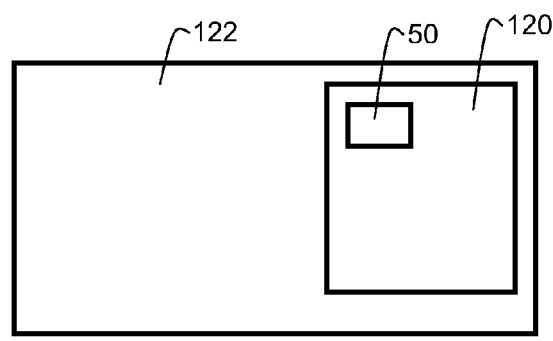
FIG. 6 schematically shows an example of an embodiment of a safety critical system comprising a processing device having a signalling circuit.

Referring to FIG. 6, an example of an embodiment of a safety critical system 122 comprising a processing device 120 having a signalling circuit 50 is schematically shown.

A processing device 120 may comprise a signalling circuit 50 as described above. A processing device may, for example, be a microprocessor or microcontroller unit (MCU) comprising or connected to a signalling circuit 50 or interface device for connecting to a communication network and may, for example, be provided as a system on a chip (SoC).

A safety critical system 122 may comprise a processing device 120 or a signalling circuit 50 as described above. A safety critical system may, for example, be a vehicle or may be comprised in a vehicle. A vehicle may be a car, a motor bike or a plane, just to name a few.

A safety critical system in an automotive environment may be a system whose failure may result in a dangerous situation. A safety critical system may be, for example, a car safety system. A safety critical system may comprise a seat position control system, lighting, windscreen wipers, immobilizers, electronic climate control, a brake system or an electrical steering system, just to name a few. A brake system may comprise, for example, an anti-lock braking system (ABS), an electronic brakeforce distribution system (EBD), a cornering brake control (CBC) system etc. An electrical steering system may comprise, for example, an electronic stability control system (ESC), a traction control system (TCS) or anti-slip regulation system (ASR), an adaptive cruise control (ACC) system, a forward collision warning (FCW) system etc.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the transmit signal generation unit 78 may be connected to the signalling circuit 50 or it may be comprised in the signalling circuit.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the control unit 92 or the transmit signal generation unit 78 may be provided within the same device as the signalling circuit 50. Alternatively, the examples may be implemented as any number of separate integrated circuits or separate devices interconnected with each other in a suitable manner. For example, the control unit 92 or the transmit signal generation unit 78 may be provided on separate integrated circuit devices.

Also for example, the examples, or portions thereof, may be implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. A signalling circuit for a signal channel of a communication network, comprising:
    a communication network terminal connectable to said signal channel and to a voltage supply;
    an input terminal connectable to receive a transmit signal;
    a driver device comprising
        a first driver terminal connected to said communication network terminal,
        a second driver terminal connected to ground, and
        a driver control terminal connected to said input terminal;
    wherein said driver device is arranged to connect said communication network terminal to ground in response to a transition from a low to a high voltage driver control signal state of a driver control signal received at said driver control terminal;
    a feedback circuit connected to said first driver terminal and said driver control terminal and comprising a capacitive device; and
    a pull-down device arranged to connect said driver control terminal to ground after a predefined delay after a transition of said transmit signal from a low to a high voltage transmit signal state.

2. The signalling circuit as claimed in claim 1, wherein said signalling circuit is comprised in a Local Interconnect Network device.

3. The signalling circuit as claimed in claim 1, wherein said feedback circuit comprises a source follower transistor device.

4. The signalling circuit as claimed in claim 1, comprising a control unit arranged to provide a pull-down signal, and wherein said pull-down device comprises a pull-down control terminal arranged to receive said pull-down signal for connecting said driver control terminal to ground.

5. The signalling circuit as claimed in claim 1, wherein said pull-down device comprises a transistor device.

6. The signalling circuit as claimed in claim 1, wherein said predefined delay is longer than a rise time from said low to said high voltage driver control signal state.

7. The signalling circuit as claimed in claim 1, wherein said predefined delay depends on a physical condition of said signalling circuit.

8. The signalling circuit as claimed in claim 1, wherein said predefined delay depends on an operation mode of said communication network.

9. A processing device, comprising a signalling circuit as claimed in claim 1.

10. A safety critical system comprising a processing device as claimed in claim 9.

* * * * *